(12) United States Patent
Kashiwagi

(10) Patent No.: US 7,428,676 B2
(45) Date of Patent: Sep. 23, 2008

(54) BOUNDARY SCAN DEVICE

(75) Inventor: Shinji Kashiwagi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 601 days.

(21) Appl. No.: 10/654,972

(22) Filed: Sep. 5, 2003

(65) Prior Publication Data

US 2004/0165071 A1 Aug. 26, 2004

(30) Foreign Application Priority Data

Sep. 5, 2002 (JP) ............................. 2002-260040

(51) Int. Cl.
*G01R 31/28* (2006.01)
(52) U.S. Cl. ................... 714/727; 714/724; 714/726; 714/729
(58) Field of Classification Search ............... 714/724, 714/726, 727, 729, 30, 733, 734; 716/4
See application file for complete search history.

(56) References Cited

U.S. PATENT DOCUMENTS 6,092,226 A * 7/2000 Kramer et al. ............... 714/727

6,973,609 B2 * 12/2005 Hong ........................ 714/726
2003/0149924 A1 * 8/2003 Bedal et al. ................ 714/726

FOREIGN PATENT DOCUMENTS

| CN | 1438492 A | 8/2003 |
|---|---|---|
| JP | H01-110275 A | 4/1989 |
| JP | 3-4186 A | 1/1991 |
| JP | H06-186308 A | 7/1994 |
| JP | 10-197603 A | 7/1998 |
| JP | 10-326301 A | 12/1998 |
| JP | 11-101859 A | 4/1999 |
| JP | 11-258304 A | 9/1999 |
| JP | 11-326460 A | 11/1999 |
| JP | 2001-142736 A | 5/2001 |

* cited by examiner

*Primary Examiner*—Phung M Chung
(74) *Attorney, Agent, or Firm*—Sughrue Mion, PLLC

(57) ABSTRACT

A boundary-scan device in which a plurality of signal paths are connected to the macro, each having a data signal input end and a data signal output end for signal transmission during normal mode operations. A plurality of circuits is provided for the plurality of signal paths, respectively. Each circuit is capable of capturing a signal transmission event that a signal has past through one of the plurality of signal paths during test mode operations.

23 Claims, 6 Drawing Sheets

BOUNDARY SCAN DEVICE

FIELD OF THE INVENTION

The present invention relates to boundary scan devices, and more particularly to boundary scan devices provided to control and observe signals at macro boundaries.

DESCRIPTION OF THE RELATED ART

As the geometry of boards continue to shrink and integrated circuit (IC) density increases, testing of ICs on boards and their interconnection by a probe mechanism becomes more difficult. To facilitate testing of ICs, the IEEE standard 1149.1 specifies a boundary-scan architecture and a protocol which defines test logic that can be used with ICs in a standardized approach to testing the IC and interconnections between IC components when assembled on a printed circuit board to form a product. The standard is intended to confirm 1) that each device or component performs its required function, 2) that components are interconnected correctly, and 3) that components interact correctly and that the product performs its intended function.

In general, a number of boundary-scan cells are interconnected to each other and to a device under test (DUT) to form a boundary scan device, i.e., a device equipped with boundary-scan test capability, as defined by the above referenced IEEE standard. The boundary scan cells for the pins of the device under test are interconnected to form a scan chain, i.e., shift register chain, around the boarder of the device under test. This chain is provided with serial scan input and output connections and appropriate clock and control signals.

By providing boundary scan devices in signal paths between an internal circuitry of each on-board integrated circuit and in signal paths between the internal circuitries and external terminals, the boundary scan devices provide a means of observing and transmitting data flowing into each integrated circuit through its input pins and data delivering out of the integrated circuit through its output pins during normal mode of operations. During test mode of operations, the boundary scan devices can load the internal circuitries or the external terminals with test pattern data and shift out the results to verify that data transmission between the on-board integrated circuits is properly carried out.

JP-A 10-326301 discloses a connect test between a plurality of macros (i.e., modules or blocks) of an LSI, i.e., a verification that all of the macros are properly interconnected, without relying on a boundary-scan device.

FIG. 1 is a block diagram of a custom LSI 10 illustrating how a number of input boundary-scan cells $BI_1, BI_2 \ldots BI_x$ are interconnected to each other and connected to input pins of a macro 12, respectively, to form an input-side portion of a scan chain 14 of a boundary-scan device 16. Also illustrated is how a number of output boundary-scan cells $BO_1, BO_2 \ldots BO_x$ are interconnected to each other and to output pins of the macro 12 to form an output-side portion of the scan chain 14 of the boundary scan device 16. The input boundary-scan cells $BI_1, BI_2 \ldots BI_x$ are connected also to output pins of a peripheral circuit 18, respectively. The output boundary-scan cells $BO_1, BO_2 \ldots BO_x$ are connected also to input pins of the peripheral circuit 18. The custom LSI is a semiconductor integrated circuit designed to meet user's specification and equipped with functional capability requested by the user.

With continuing reference to FIG. 1, the macro 12 is a functional block designed and verified by a supplier and may be presented to a user as intellectual property (IP). In most cases, without knowing what peripheral circuitry is provided, the supplier designs the macro 12 as an independent block. For ease of verification that internal combinational circuits 20 and 22 properly operate, the supplier equips the macro 12 with a scan chain 24. The scan chain 24 includes scan cells 26 for output pins of the combinational circuit 20 and scan cells 28 for input pins of the combinational circuit 22. The scan cells 26 and 28 are interconnected to form a shift-register chain provided with serial input and output external connection test terminals IpSI and IpSO during test mode operations. During normal mode operations, the scan cells 26 and 28 act as independent flip-flops, respectively.

Using netlists of library cells, the supplier designs and fabricates the peripheral circuit 18 to meet the user's specification. The peripheral circuit 18 and the macro 12 are interconnected and cooperate with each other to perform the functions requested by the user. For ease of verification that internal combinational circuits 30 and 32 properly operate, the peripheral circuit 18 is equipped with a scan chain 34. The scan chain 34 includes scan cells 36 for input pins of the combinational circuit 30 and scan cells 38 for output pins of the combinational circuit 32. The scan cells 36 and 38 are interconnected to form a shift-register chain provided with serial input and output external connection test terminals USI and USO during test mode operations. During normal mode operations, the scan cells 36 and 38 act as independent flip-flops, respectively.

As mentioned before, the boundary-scan device 16 includes the scan chain 14. The scan chain 14 includes input boundary-scan cells $BI_1, BI_2 \ldots BI_x$ for the output pins of the peripheral circuit 18 and the input pins of the macro 12, and output boundary-scan cells $BO_1, BO_2 \ldots BO_x$ for the output pins of the macro 12 and the input pins of the peripheral circuit 18. During test mode of operations, the input boundary-scan cells $BI_1, BI_2 \ldots BI_x$ and the output boundary-scan cells $BO_1, BO_2 \ldots BO_x$ are interconnected to form a shift-register chain provided with serial input and output external connection test terminals BSI and BSO during test mode operations. During normal mode operations, the boundary-scan cells $BI_1, BI_2 \ldots BI_x$ and $BO_1, BO_2 \ldots BO_x$ provide a means of observing and transmitting data flowing into the macro 12 through its input pins and data delivering out of the macro 12 through its output pins. During test mode of operations, the boundary-scan cells $BI_1, BI_2 \ldots BI_x$ and $BO_1, BO_2 \ldots BO_x$ shift test pattern data and shift out the results for test.

FIG. 7 is an exemplary implementation of a boundary-scan cell 40 that could be used for each of the input boundary-scan cells $BI_1, BI_2 \ldots BI_x$. FIG. 8 is an exemplary implementation of a boundary-scan cell 80 that could be used for each of the output boundary-scan cells $BO_1, BO_2 \ldots BO_x$.

With reference to FIG. 7, the input boundary-scan cell 40 includes a signal path 42 for an input pin of the macro 12. The signal path 42 has a data signal input end 44 and a data signal output end 46. At the data signal input end 44, the boundary-scan cell 40 is coupled to one of a plurality of output pins of the peripheral circuit 18. At the data signal output end 46, the boundary-scan cell 40 is coupled to one of a plurality of input pins of the macro 12. The input boundary-scan cell 40 includes a circuitry 48. Components of the circuitry 48 are a gate 50, a scan cell 52 and a selector 54.

The gate 50 has a first input 56 coupled to the data signal input end 44, a second input 58 coupled to a source of a test control signal ExSCANTEST, and an output 60. The test control signal ExSCANTEST indicates a device under test. The test control signal ExSCANTEST is at "1" level when the peripheral circuit 18 is a device under test, and at "0" level when the macro 12 is a device under test. If the test control signal ExSCANTEST is at "1" level, the gate 50 receives a signal on the data signal input end 44 as the first input 56 and provides it as the output 60. If the test control signal ExSCANTEST is at "0" level, the gate 50 provides a fixed value of "0" as the output 60. As the output 60, the fixed value is not limited to "0". The fixed value of any magnitude, for example, "1" may suffice as the output 60 if the test control signal is at "0" level. As the discussion proceeds, it will be noted that the signal on the output 60 is captured by the scan cell 52. For convenience in testing, the signal on the output 60 is held invariable when the peripheral circuit 18 is not a device under test, i.e., when the macro 12 is a device under test.

The scan cell 52 is of the multiplexer type although it may be of the level sensitive scan design (LSSD) type. The scan cell 52 includes a selector 62 and a flip-flop (not shown). The selector 62 receives as its capturing input 64 the output 60 of the gate 50 and as its shift input 66 test pattern data on a scan input 68. In response to a test control signal SCANEN, the selector 62 selects its capturing input 64 and provides it as its output. Specifically, the selector 62 selects its capturing input 64 and provides it as its output when the test control signal SCANEN is at "0" level, but it selects its shift input 66 and provides it as its output when the test control signal SCANEN is at "1" level. During test mode operations, the flip-flop receives the output of the selector 62 as its data input and it is clocked by a clock signal CLK to shift the data input to provide a shift output on a scan output 70. The flip-flop updates the shift output of the flip-flop by a series to parallel conversion to provide an updated output 72. In response to a test control signal SCANTEST indicative of test mode operations, the scan cells 52 are interconnected to form an input-side portion of scan chain 14 (see FIG. 1) between the serial input and output external connection test terminals BSI and BSO. During test mode operations, in response to the test control signal SCANEN that controls capturing action and the clock signal CLK, the output 60 of each gate 50 is captured and shifted, and the shift output is updated by the series to parallel conversion to provide the updated output 72.

The selector 54 receives, as its inputs, the updated output 72 and the data signal on the data signal input end 44. In response to the test control signal SCANTEST, the selector 54 selects the updated output 72 and provides it, as its output, on the data signal output end 46. Specifically, as the test control signal SCANTEST is at "1" level during test mode operations, the selector 54 selects the updated output 72 as its output. The test control signal SCANTEST is at "0" level during normal mode operations so that the selector 54 selects the data signal on the data signal input end 44. Thus, during normal mode operations, the selector 54 allows transmission of signal from the data signal input end 44 to the data signal output end 46 through the signal path 42.

With reference now to FIG. 8, the output boundary-scan cell 80 includes a signal path 82 for an output pin of the macro 12. The signal path 82 has a data signal input end 84 and a data signal output end 86. At the data signal input end 84, the boundary-scan cell 80 is coupled to one of a plurality of output pins of the macro 12. At the data signal output end 86, the boundary-scan cell 80 is coupled to one of a plurality of input pins of the peripheral circuit 18. The output boundary-scan cell 80 includes a circuitry 88. Components of the circuitry 88 are a gate 90, a scan cell 92 and a selector 94.

The gate 90 has a first input 96 coupled to the data signal input end 84, a second inverted input 98 coupled to the source of test control signal ExSCANTEST, and an output 100. As different from the gate 50, the gate 90 is responsive to an inverted version of the test control signal ExSCANTEST. If the test control signal ExSCANTEST is at "0" level, the gate 90 receives a signal on the data signal input end 84 as the first input 96 and provides it as the output 100. If the test control signal ExSCANTEST is at "1" level, the gate 90 provides a fixed value of "0" as the output 100. As the output 100, the fixed value is not limited to "0". The fixed value of any magnitude, for example, "1" may suffice as the output 100 if the test control signal ExSCANTEST is at "1" level. As the discussion proceeds, it will be noted that the signal on the output 100 is captured by the scan cell 92. For convenience in testing, the signal on the output 100 is held invariable when the peripheral circuit 18 is a device under test, i.e., when the macro 12 is not a device under test.

The scan cell 92 is of the multiplexer type although it may be of the level sensitive scan design (LSSD) type. The scan cell 92 includes a selector 102 and a flip-flop (not shown). The selector 102 receives as its capturing input 104 the output 100 of the gate 90 and as its shift input 106 test pattern data on a scan input 108. In response to the test control signal SCANEN, the selector 102 selects its capturing input 104 and provides it as its output. Specifically, the selector 102 selects its capturing input 104 and provides it as its output when the test control signal SCANEN is at "0" level, but it selects its shift input 106 and provides it as its output when the test control signal SCANEN is at "1" level. During test mode operations, the flip-flop receives the output of the selector 102 as its data input and it is clocked by the clock signal CLK to shift the data input to provide a shift output on a scan output 110. The flip-flop updates the shift output of the flip-flop by a series to parallel conversion to provide an updated output 112. In response to the test control signal SCANTEST indicative of test mode operations, the scan cells 92 are interconnected to form an output-side portion of scan chain 14 (see FIG. 1) between the serial input and output external connection test terminals BSI and BSO. During test mode operations, in response to the test control signal SCANEN that controls capturing action and the clock signal CLK, the output 100 of each gate 90 is captured and shifted, and the shift output is updated by the series to parallel conversion to provide the updated output 112.

The selector 94 receives, as its inputs, the updated output 112 and the data signal on the data signal input end 84. In response to the test control signal SCANTEST, the selector 94 selects the updated output 112 and provides it, as its output, on the data signal output end 86. Specifically, as the test control signal SCANTEST is at "1" level during test mode operations, the selector 94 selects the updated output 112 as its output. The test control signal SCANTEST is at "0" level during normal mode operations so that the selector 94 selects the data signal on the data signal input end 84. Thus, during normal mode operations, the selector 94 allows transmission of signal from the data signal input end 84 to the data signal output end 86 through the signal path 82.

In preparation for testing the custom LSI 10, an automatic test pattern generator (ATPG) automatically generates appropriate test patterns used by the scan chains 14, 24 and 34 based on information derived from netlists of library cells. During test mode operations, circuit components of the custom LSI are isolated by the adjacent two scan chains one after another and tested using the appropriate test pattern.

To allow the combinational circuits 30 and 32 within the peripheral circuit 18 to be tested, the scan chain 34 within the peripheral circuit 18 and the scan chain 14 within the boundary scan device 16 are used. In this case, the test control signal SCANTEST is at "1" level and the test control signal ExSCANTEST is at "1" level.

On the side of the input pins of the macro 12, the appropriate test pattern data is used as input signal to the scan chain 34 within the peripheral circuit 18 through the serial input external connection test terminal USI. The input scan cells 36 shift the test data and provide updated outputs, as inputs, to the combinational circuit 30. Outputs of the combinational circuit 30 are delivered out of the peripheral circuit 18 through its output pins to the data signal input ends 44 of the input boundary-scan cells $BI_1, BI_2 \ldots BI_x$. The signals on the data signal input ends 44 are allowed by the gates 50 to reach the capturing inputs 64 of the scan cells 52, and captured in response to the test control signal SCANEN and clock signal CLK. The captured data are shifted out of the scan chain 14 of the boundary-scan device 16 through the serial output external connection test terminal BSO for test.

On the side of the output pins of the macro 12, the appropriate test pattern data is used as input signal to the scan chain 14 of the boundary-scan device 16 through the serial input external connection test terminal BSI. The scan cells 52 and 92 shift the test data to enable scan cells 92 to provide updated outputs 112. The updated outputs 112 are selected by selectors 92 and delivered out of the output boundary-scan cells $BO_1, BO_2 \ldots BO_x$ through the data signal output ends 86. The signals on the data signal output ends 86 are fed, as inputs, to the combinational circuit 32 through the input pins of the peripheral circuit 18. Outputs of the combinational circuit 32 are fed to the scan cells 38 of the scan chain 34 within the peripheral circuit 18 and captured by the scan cells 38 and shifted out of the scan chain 34 through the serial output external connection test terminal USO for test.

To allow the combinational circuits 20 and 22 within the macro 12 to be tested, the scan chain 14 within the boundary scan device 16 and the scan chain 24 within the macro 12 are used. In this case, the test control signal SCANTEST is at "1" level and the test control signal ExSCANTEST is at "0" level.

On the side of the input pins of the macro 12, the appropriate test pattern data is used as input signal to the scan chain 14 of the boundary-scan device 16 through the serial input external connection test terminal BSI. The scan cells 52 shift the test data and provide updated outputs 72. The updated outputs 72 are selected by the selectors 54 and delivered out of the input boundary-scan cells $BI_1, BI_2 \ldots BI_x$ through the data signal output ends 46. The signals on the data signal output ends 46 are fed, as inputs, to the combinational circuit 20 through the input pins of the macro 12. Outputs of the combinational circuit 20 are fed to the scan cells 26 of the scan chain 24 within the macro 12 and captured by the scan cells 26 and shifted out of the scan chain 24 through the serial output external connection test terminal IpSO for test.

On the side of the output pins of the macro 12, the appropriate test pattern data is used as input signal to the scan chain 24 within the macro 12 through the serial input external connection test terminal IpSI. The output scan cells 28 shift the test data and provide updated outputs, as inputs, to the combinational circuit 22. Outputs of the combinational circuit 22 are delivered out of the macro 12 through its output pins to the data signal input ends 84 of the output boundary-scan cells $BO_1, BO_2 \ldots BO_x$. The signals on the data signal input ends 84 are allowed by the gates 90 to reach the capturing inputs 104 of the scan cells 92, and captured in response to the test control signal SCANEN and clock signal CLK. The captured data are shifted out of the scan chain 14 of the boundary-scan device 16 through the serial output external connection test terminal BSO for test.

After the various tests of the components during test mode operations, the custom LSI 10 is tested using the serial input and output external connection test terminals. In this case, the test control signal SCANTEST is at "0" level and the test control signal ExSCANTEST is at "0" level. As the test control signal SCANTEST is at "0" level, the selectors 54 of the input boundary-scan cells $BI_1, BI_2 \ldots BI_x$ allow signal transmission from the data signal input to output ends 44 and 46 through the signal paths 42, and the selectors 94 of the output boundary-scan cells $BO_1, BO_2 \ldots BO_x$ allow signal transmission from the data signal input to output ends 84 and 86 through the signal paths 82. This test is to verify that signal transmission, through the signal paths 42 and 82, between the peripheral circuit 18 and the macro 12 is proper so that the custom LSI 10 may have functional capability requested by the user.

The use of boundary-scan device 16 including conventional boundary-scan cells 40 and 80 (see FIGS. 7 and 8) enables the user to test the macro 12 using test pattern automatically generated by the automatic test pattern generator (ATPG) and provided by the supplier of the macro 12. As the user is enabled to test the macro 12, it has become no longer necessary for the supplier of the macro 12 to disclose circuit information on the macro 12. This is advantageous in preventing a leakage of circuit information on the macro 12.

The above-mentioned test of the custom LSI 10 requires appropriate test pattern. However, generation of appropriate test pattern by the automatic test pattern generator (ATPG) is difficult without netlists of library cells of the macro 12. Besides, the supplier of the macro 12 is unwilling to disclose circuit information on the macro 12. It is therefore the conventional practice to create test pattern based on the specification of user requesting functions. Testing the custom LSI 10 using this test pattern poses a problem that detecting faults in signal transmission to and out of the macro 12 through the boundary-scan device 16 is difficult.

Describing more specifically, detecting failures or faults in signal transmission through the signal paths 42 and 82 (see FIGS. 7 and 8) of the boundary-scan cells is difficult by test using the test pattern generated without knowing the circuit information on the macro 12.

Accordingly, the supplier is requested to disclose the circuit information on the macro 12 by the user if the user creates appropriate test pattern for the test of custom LSI. However, such request is hardly acceptable by the supplier because disclosing the circuit information on the macro 12 to the user increases the probability that the circuit information on the macro 12 may leak.

Accordingly, an object of the present invention is to provide a boundary-scan device, which makes it easy to detect failures or faults in signal transmission through the boundary-scan device to and out of the macro.

Another object of the present invention is to provide a boundary-scan device, which provides enhanced test quality of a custom LSI.

Further object of the present invention is to provide a boundary-scan device, which does not require disclosure of circuit information on the macro for creation of appropriate test pattern.

SUMMARY OF THE INVENTION

One exemplary implementation of the present invention provides a boundary-scan device. The boundary-scan device comprises:

a plurality of signal paths connected to a macro, each having a data signal input end and a data signal output end for signal transmission during normal mode operations; and a plurality of circuits for said plurality of signal paths, respectively, each having capability of capturing a signal transmission event that a signal has past through one of said plurality of signal paths during test mode operations.

DETAILED DESCRIPTION OF THE INVENTION

Figure 1:
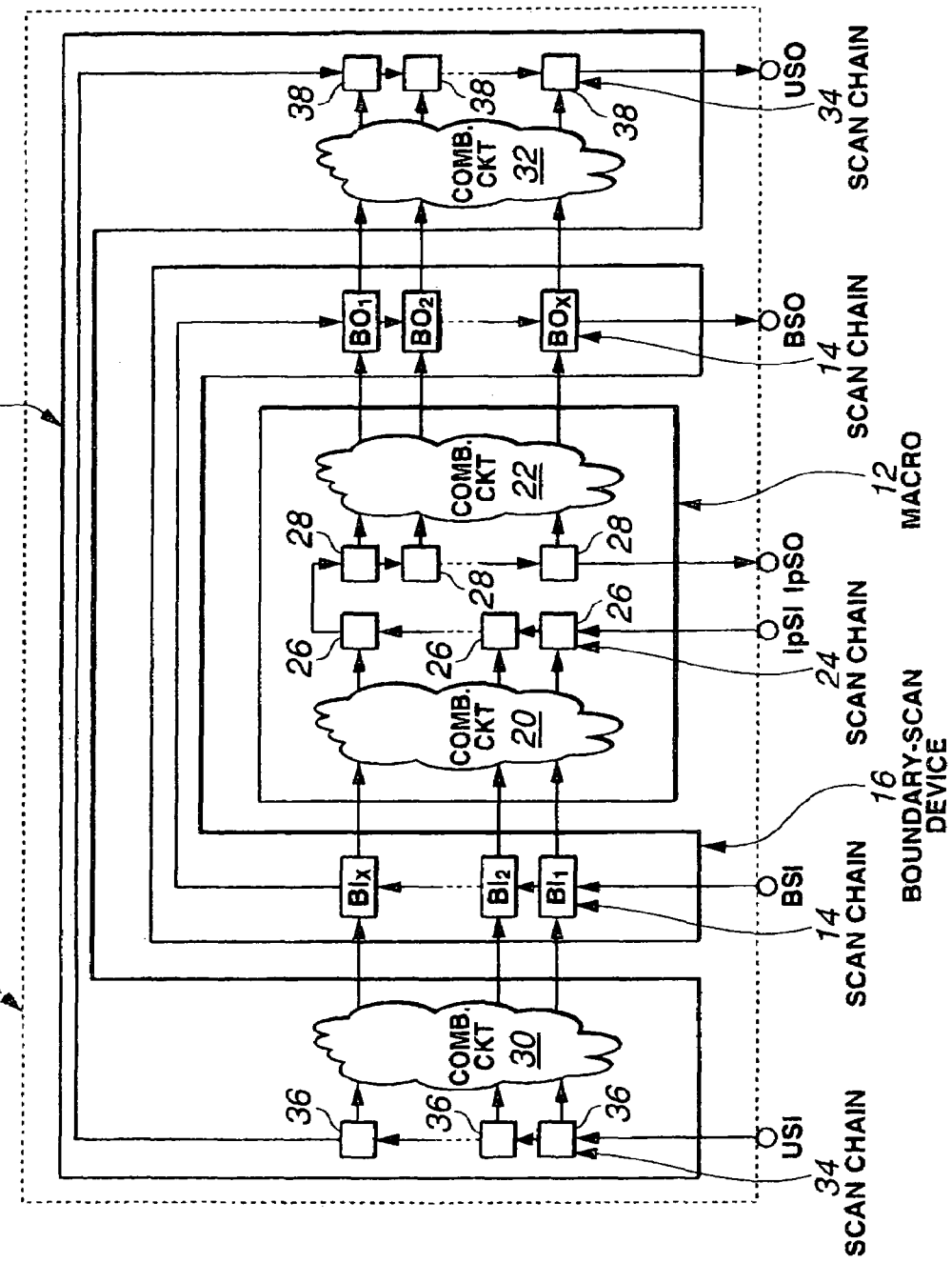
FIG. 1 is a block diagram of a custom LSI equipped with a boundary-scan device between a peripheral circuit and a macro.

First exemplary embodiment of the invention will now be described with reference to FIGS. 1 to 3. Later, second exemplary embodiment of the invention will be described with reference to FIGS. 4 to 6. Throughout each of these Figures, like reference numerals represent like elements or portions.

Referring to FIG. 1, a custom LSI 10 is illustrated. A number of input boundary-scan cells $BI_1$, $BI_2$ ... $BI_x$ for input pins of a macro 12 are interconnected to each other to form an input-side portion of a scan chain 14 of a boundary-scan device 16. A number of output boundary-scan cells $BO_1$, $BO_2$ ... $BO_x$ for output pins of the macro are interconnected to each other to form an output-side portion of the scan chain 14 of the boundary scan device 16. The input boundary-scan cells $BI_1$, $BI_2$ ... $BI_x$ are connected also to output pins of a peripheral circuit 18, respectively. The output boundary-scan cells $BO_1$, $BO_2$ ... $BO_x$ are connected also to input pins of the peripheral circuit 18.

With continuing reference to FIG. 1, for ease of verification that internal combinational circuits 20 and 22 properly operate, the macro 12 is equipped with a scan chain 24. The scan chain 24 includes scan cells 26 for output pins of the combinational circuit 20 and scan cells 28 for input pins of the combinational circuit 22. The scan cells 26 and 28 are interconnected to form a shift-register chain provided with serial input and output external connection test terminals IpSI and IpSO during test mode operations. During normal mode operations, the scan cells 26 and 28 act as independent flip-flops, respectively.

The peripheral circuit 18 and the macro 12 are interconnected and cooperate with each other to perform the functions requested by the user. The peripheral circuit 18 includes combinational circuits 30 and 32. For ease of verification that the combinational circuits 30 and 32 properly operate, the peripheral circuit 18 is equipped with a scan chain 34. The scan chain 34 includes scan cells 36 for input pins of the combinational circuit 30 and scan cells 38 for output pins of the combinational circuit 32. The scan cells 36 and 38 are interconnected to form a shift-register chain provided with serial input and output external connection test terminals USI and USO during test mode operations. During normal mode operations, the scan cells 36 and 38 act as independent flip-flops, respectively.

As mentioned before, the boundary-scan device 16 includes the scan chain 14. The scan chain 14 includes input boundary-scan cells $BI_1$, $BI_2$ ... $BI_x$ for the output pins of the peripheral circuit 18 and the input pins of the macro 12, and output boundary-scan cells $BO_1$, $BO_2$ ... $BO_x$ for the output pins of the macro 12 and the input pins of the peripheral circuit 18. During test mode of operations, the input boundary-scan cells $BI_1$, $BI_2$ ... $BI_x$ and the output boundary-scan cells $BO_1$, $BO_2$ ... $BO_x$ are interconnected to form a shift-register chain provided with serial input and output external connection test terminals BSI and BSO during test mode operations.

Figure 2:
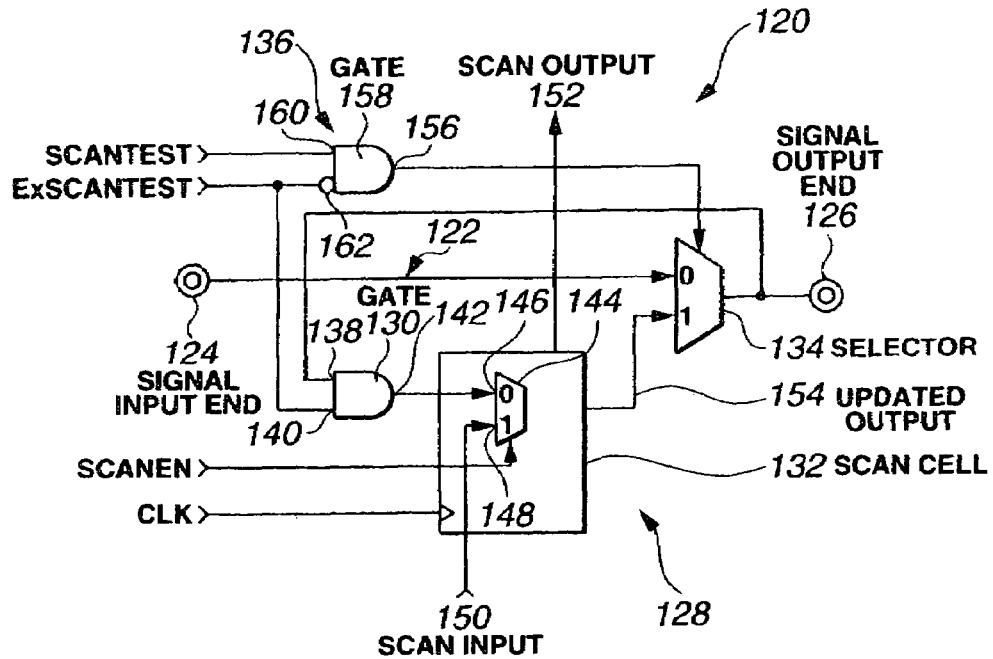
FIG. 2 illustrates an exemplary implementation of an input boundary-scan cell.

FIG. 2 illustrates an input boundary-scan cell 120 that could be used for each of the input boundary-scan cells $BI_1$, $BI_2$ ... $BI_x$ in FIG. 1. FIG. 3 illustrates an output boundary-scan cell 180 that could be used for each of the output boundary-scan cells $BO_1$, $BO_2$ ... $BO_x$ in FIG. 1

With reference to FIG. 2, the input boundary-scan cell 120 includes a signal path 122 for an input pin of the macro 12. The signal path 122 has a data signal input end 124 and a data signal output end 126. At the data signal input end 124, the boundary-scan cell 120 is coupled to one of a plurality of output pins of the peripheral circuit 18. At the data signal output end 126, the boundary-scan cell 120 is coupled to one of a plurality of input pins of the macro 12. The input boundary-scan cell 120 includes a circuitry 128. Components of the circuitry 128 are a gate 130, a scan cell 132, a selector 134, and a selector controlling logic unit 136.

Figure 7:
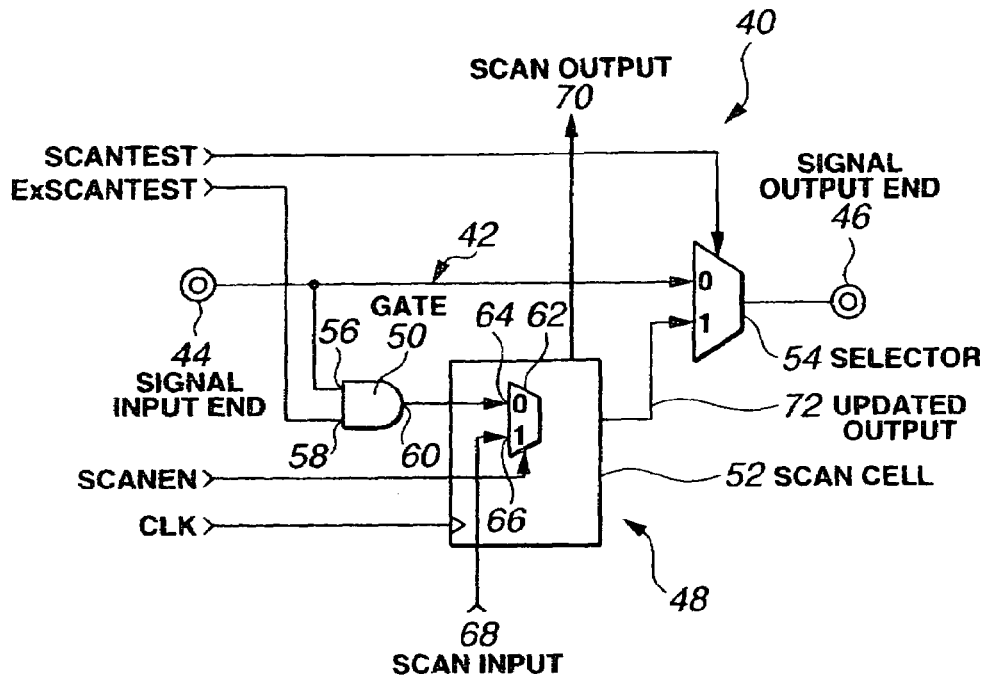
FIG. 7 illustrates an exemplary implementation of a conventional input boundary-scan cell.
Figure 8:
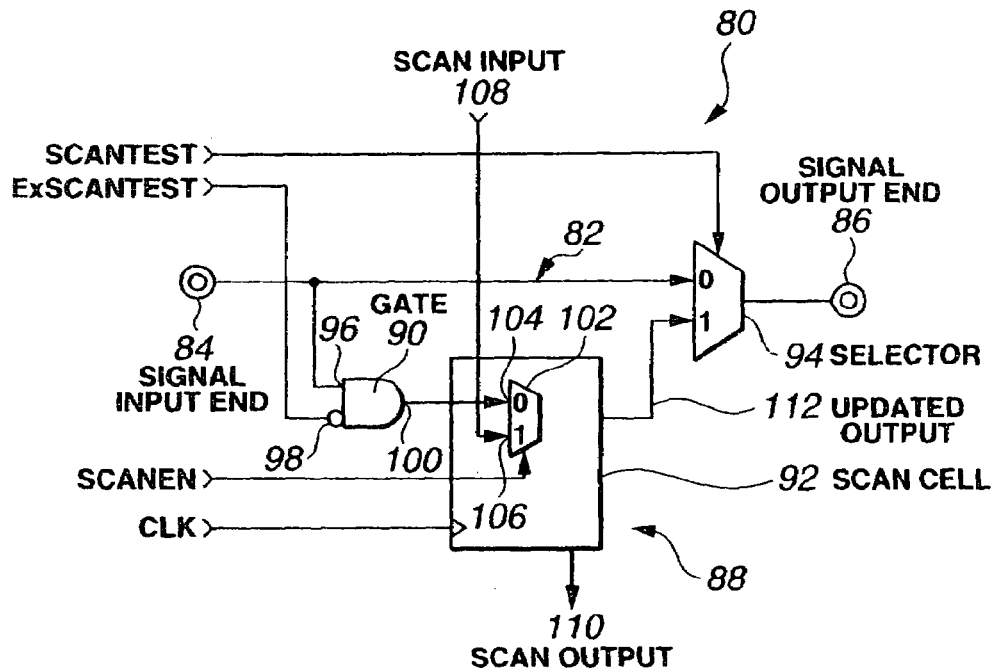
FIG. 8 illustrates an exemplary implementation of a conventional output boundary-scan cell.

The gate 130 has a first input 138 coupled to the data signal output end 126, a second input 140 coupled to a source of a test control signal ExSCANTEST, and an output 142. The test control signal ExSCANTEST indicates a device under test. The test control signal ExSCANTEST is at "1" level when the peripheral circuit 18 is a device under test, and at "0" level when the macro 12 is a device under test. If the test control signal ExSCANTEST is at "1" level, the gate 130 receives a signal on the data signal output end 126 as the first input 138 and provides it as the output 142. If the test control signal ExSCANTEST is at "0" level, the gate 130 provides a fixed value of "0" as the output 142. As the output 142, the fixed value is not limited to "0". The fixed value of any magnitude, for example, "1" may suffice as the output 142 if the test control signal ExSCANTEST is at "0" level. As the discussion proceeds, it will be noted that the signal on the output 142 is captured by the scan cell 132. For convenience in testing, the signal on the output 142 is held invariable when the peripheral circuit 18 is not a device under test, i.e., when the macro 12 is a device under test. From the description of this section, it is to be noted that the gate 130 is different from the gate 50 (see FIG. 7) only in that the first input 138 is coupled to the signal output end 126 and exposed to data signal thereon.

The scan cell 132 is of the multiplexer type although it may be of the level sensitive scan design (LSSD) type. The scan cell 132 includes a selector 144 and a flip-flop (not shown). The selector 144 receives, as its capturing input 146, the output 142 of the gate 130 and, as its shift input 148, test pattern data on a scan input 150. In response to a test control signal SCANEN, the selector 144 selects its capturing input 146 and provides it as its output. Specifically, the selector 144 selects its capturing input 146 and provides it as its output when the test control signal SCANEN is at "0" level, but it selects its shift input 148 and provides it as its output when the test control signal SCANEN is at "1" level. During test mode operations, the flip-flop receives the output of the selector 144 as its data input and it is clocked by a clock signal CLK to shift the data input to provide a shift output on a scan output 152. The flip-flop updates the shift output of the flip-flop by a series to parallel conversion to provide an updated output 154. The scan cells 132 are interconnected to form an input-side portion of scan chain 14 (see FIG. 1) between the serial input and output external connection test terminals BSI and BSO. During test mode operations, in response to the test control signal SCANEN that controls capturing action and the clock signal CLK, the output 142 of each gate 130 is captured and shifted, and the shift output is updated by the series to parallel conversion to provide the updated output 154.

The selector 134 receives, as its inputs, the updated output 154 and the data signal on the data signal input end 124. In response to an output 156 of the selector controlling logic unit 136, the selector 134 selects the updated output 154 and provides it, as its output, on the data signal output end 126. Specifically, the selector 134 selects the updated output 154 as its output when the output 156 is at "1" level. The selector 134 selects the data signal on the data signal input end 124 when the output 156 is at "0" level.

The selector controlling logic unit 136 includes a logical element in the form of a gate 158. The gate 158 has a first input 160 coupled to a source of a test control signal SCANTEST and a second inverted input 162 coupled to a source of a test control signal ExSCANTEST. In the embodiment, the output 156 is at "1" level when the test control signal SCANTEST is at "1" level and the test control signal ExSCANTEST is at "0" level. Otherwise, the output 156 is at "0" level. The gate 158 is common to all of the selectors 134 of the input boundary-scan cells $BI_1$, $BI_2$ . . . $BI_x$ so that only one of such gate 158 may be used to control all of the selectors 134.

Figure 3:
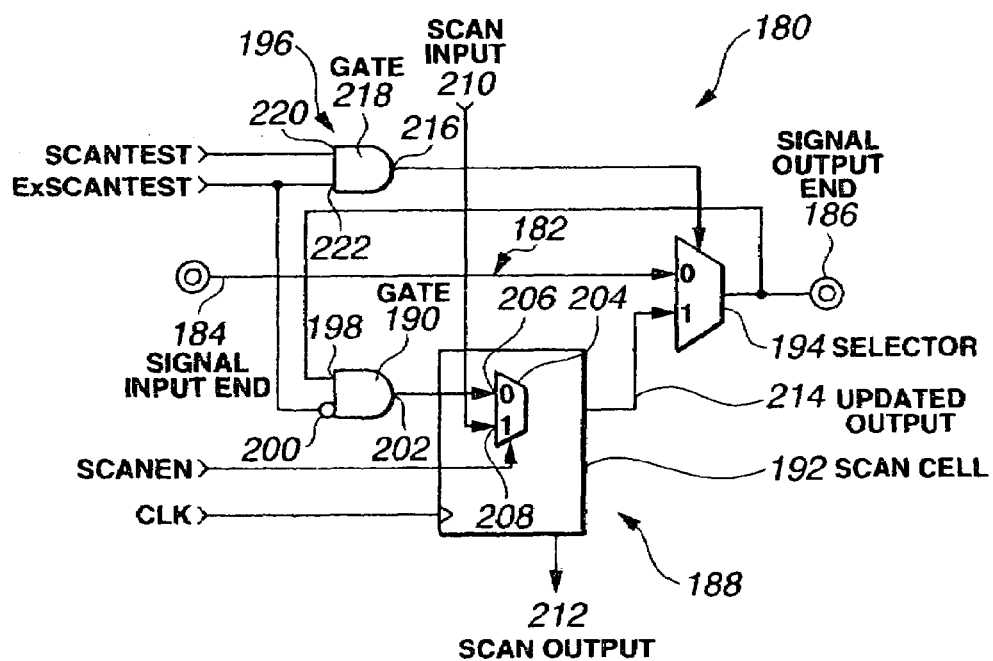
FIG. 3 illustrates an exemplary implementation of an output boundary-scan cell.

With reference now to FIG. 3, the output boundary-scan cell 180 includes a signal path 182 for an output pin of the macro 12. The signal path 182 has a data signal input end 184 and a data signal output end 186. At the data signal input end 184, the boundary-scan cell 180 is coupled to one of a plurality of output pins of the macro 12. At the data signal output end 186, the boundary-scan cell 180 is coupled to one of a plurality of input pins of the peripheral circuit 18. The output boundary-scan cell 180 includes a circuitry 188. Components of the circuitry 188 are a gate 190, a scan cell 192, a selector 194, and a selector controlling logic unit 196.

The gate 190 has a first input 198 coupled to the data signal output end 186, a second inverted input 200 coupled to the source of test control signal ExSCANTEST, and an output 202. As different from the gate 130, the gate 190 is responsive to an inverted version of the test control signal ExSCANTEST. If the test control signal ExSCANTEST is at "0" level, the gate 190 receives a signal on the data signal output end 186 as the first input 198 and provides it as the output 202. If the test control signal ExSCANTEST is at "1" level, the gate 190 provides a fixed value of "0" as the output 202. As the output 202, the fixed value is not limited to "0". The fixed value of any magnitude, for example, "1" may suffice as the output 202 if the test control signal ExSCANTEST is at "1" level. As the discussion proceeds, it will be noted that the signal on the output 202 is captured by the scan cell 192. For convenience in testing, the signal on the output 202 is held invariable when the peripheral circuit 18 is a device under test, i.e., when the macro 12 is not a device under test.

The scan cell 192 is of the multiplexer type although it may be of the level sensitive scan design (LSSD) type. The scan cell 92 includes a selector 204 and a flip-flop (not shown). The selector 204 receives as its capturing input 206 the output 202 of the gate 190 and as its shift input 208 test pattern data on a scan input 210. In response to the test control signal SCANEN, the selector 204 selects its capturing input 206 and provides it as its output. Specifically, the selector 204 selects its capturing input 206 and provides it as its output when the test control signal SCANEN is at "0" level, but it selects its shift input 208 and provides it as its output when the test control signal SCANEN is at "1" level. During test mode operations, the flip-flop receives the output of the selector 204 as its data input and it is clocked by the clock signal CLK to shift the data input to provide a shift output on a scan output 212. The flip-flop updates the shift output of the flip-flop by a series to parallel conversion to provide an updated output 112. The scan cells 192 are interconnected to form an output-side portion of scan chain 14 (see FIG. 1) between the serial input and output external connection test terminals BSI and BSO. During test mode operations, in response to the test control signal SCANEN that controls capturing action and the clock signal CLK, the output 202 of each gate 190 is captured and shifted, and the shift output is updated by the series to parallel conversion to provide the updated output 214.

The selector 194 receives, as its inputs, the updated output 214 and the data signal on the data signal input end 184. In response to an output 216 of the selector controlling logic unit 196, the selector 194 selects the updated output 214 and provides it, as its output, on the data signal output end 186. Specifically, the selector 194 selects the updated output 214 as its output when the output 216 is at "1" level. The selector 194 selects the data signal on the data signal input end 184 when the output 216 is at "0" level.

The selector controlling logic unit 196 includes a logical element in the form of a gate 218. The gate 218 has a first input 220 coupled to the source of test control signal SCANTEST and a second input 222 coupled to the source of test control signal ExSCANTEST. In the embodiment, the output 216 is at "1" level when the test control signal SCANTEST is at "1" level and the test control signal ExSCANTEST is at "1" level. Otherwise, the output 216 is at "0" level. The gate 218 is common to all of the selectors 194 of the output boundary-scan cells $BO_1$, $BO_2$ . . . $BO_x$ so that only one of such gate 218 may be used to control all of the selectors 194.

In preparation for testing the custom LSI 10, an automatic test pattern generator (ATPG) automatically generates appropriate test patterns used by the scan chains 14, 24 and 34 based on information derived from netlists of library cells. During test mode operations, circuit components of the custom LSI are isolated by the adjacent two scan chains one after another and tested using the appropriate test pattern.

To allow the combinational circuits 30 and 32 within the peripheral circuit 18 to be tested, the scan chain 34 within the peripheral circuit 18 and the scan chain 14 within the boundary scan device 16 are used. In this case, the test control signal SCANTEST is at "1" level and the test control signal ExSCANTEST is at "1" level.

On the side of the input pins of the macro 12, the appropriate test pattern data is used as input signal to the scan chain 34 within the peripheral circuit 18 through the serial input external connection test terminal USI. The input scan cells 36 shift the test data and provide updated outputs, as inputs, to the combinational circuit 30. Outputs of the combinational circuit 30 are delivered out of the peripheral circuit 18 through its output pins to the data signal input ends 124 of the input boundary-scan cells $BI_1$, $BI_2$ . . . $BI_x$. The signals on the data signal input ends 124 are allowed by the selectors 134 to appear at the data signal output ends 126. The signals at the data signal output ends 126 are allowed by the gates 130 to reach the capturing inputs 146 of the scan cells 132, and captured in response to the test control signal SCANEN and clock signal CLK. The captured data are shifted out of the scan chain 14 of the boundary-scan device 16 through the serial output external connection test terminal BSO for test.

On the side of the output pins of the macro 12, the appropriate test pattern data is used as input signal to the scan chain 14 of the boundary-scan device 16 through the serial input external connection test terminal BSI. The scan cells 132 and 192 shift the test data to enable scan cells 192 to provide updated outputs 214. The updated outputs 214 are selected by selectors 194 and delivered out of the output boundary-scan cells $BO_1$, $BO_2$ ... $BO_x$ through the data signal output ends 186. The signals on the data signal output ends 186 are fed, as inputs, to the combinational circuit 32 through the input pins of the peripheral circuit 18. Outputs of the combinational circuit 32 are fed to the scan cells 38 of the scan chain 34 within the peripheral circuit 18 and captured by the scan cells 38 and shifted out of the scan chain 34 through the serial output external connection test terminal USO for test.

To allow the combinational circuits 20 and 22 within the macro 12 to be tested, the scan chain 14 within the boundary-scan device 16 and the scan chain 24 within the macro 12 are used. In this case, the test control signal SCANTEST is at "1" level and the test control signal ExSCANTEST is at "0" level.

On the side of the input pins of the macro 12, the appropriate test pattern data is used as input signal to the scan chain 14 of the boundary-scan device 16 through the serial input external connection test terminal BSI. The scan cells 132 shift the test data and provide updated outputs 154. The updated outputs 154 are selected by the selectors 134 and delivered out of the input boundary-scan cells $BI_1$, $BI_2$ ... $BI_x$ through the data signal output ends 126. The signals on the data signal output ends 126 are fed, as inputs, to the combinational circuit 20 through the input pins of the macro 12. Outputs of the combinational circuit 20 are fed to the scan cells 26 of the scan chain 24 within the macro 12 and captured by the scan cells 26 and shifted out of the scan chain 24 through the serial output external connection test terminal IpSO for test.

On the side of the output pins of the macro 12, the appropriate test pattern data is used as input signal to the scan chain 24 within the macro 12 through the serial input external connection test terminal IpSI. The output scan cells 28 shift the test data and provide updated outputs, as inputs, to the combinational circuit 22. Outputs of the combinational circuit 22 are delivered out of the macro 12 through its output pins to the data signal input ends 184 of the output boundary-scan cells $BO_1$, $BO_2$ ... $BO_x$. The signals on the data signal input ends 184 are allowed by the selectors 194 to appear at the data signal output ends 186. The signals at the data signal output ends 186 are allowed by the gates 190 to reach the capturing inputs 206 of the scan cells 192, and captured in response to the test control signal SCANEN and clock signal CLK. The captured data are shifted out of the scan chain 14 of the boundary-scan device 16 through the serial output external connection test terminal BSO for test.

After the various tests of the components during test mode operations, the custom LSI 10 is tested using the serial input and output external connection test terminals. In this case, the test control signal SCANTEST is at "0" level and the test control signal ExSCANTEST is at "0" level. As the test control signal SCANTEST is at "0" level, the selectors 134 of the input boundary-scan cells $BI_1$, $BI_2$ ... $BI_x$ allow signal transmission from the data signal input to output ends 124 and 126 through the signal paths 122, and the selectors 194 of the output boundary-scan cells $BO_1$. $BO_2$ ... $BO_x$ allow transmission from the data signal input to output ends 184 and 186 through the signal paths 182. This test is to verify that signal transmission, through the signal paths 122 and 182, between the peripheral circuit 18 and the macro 12 is proper so that the custom LSI 10 may have functional capability requested by the user.

Figure 4:
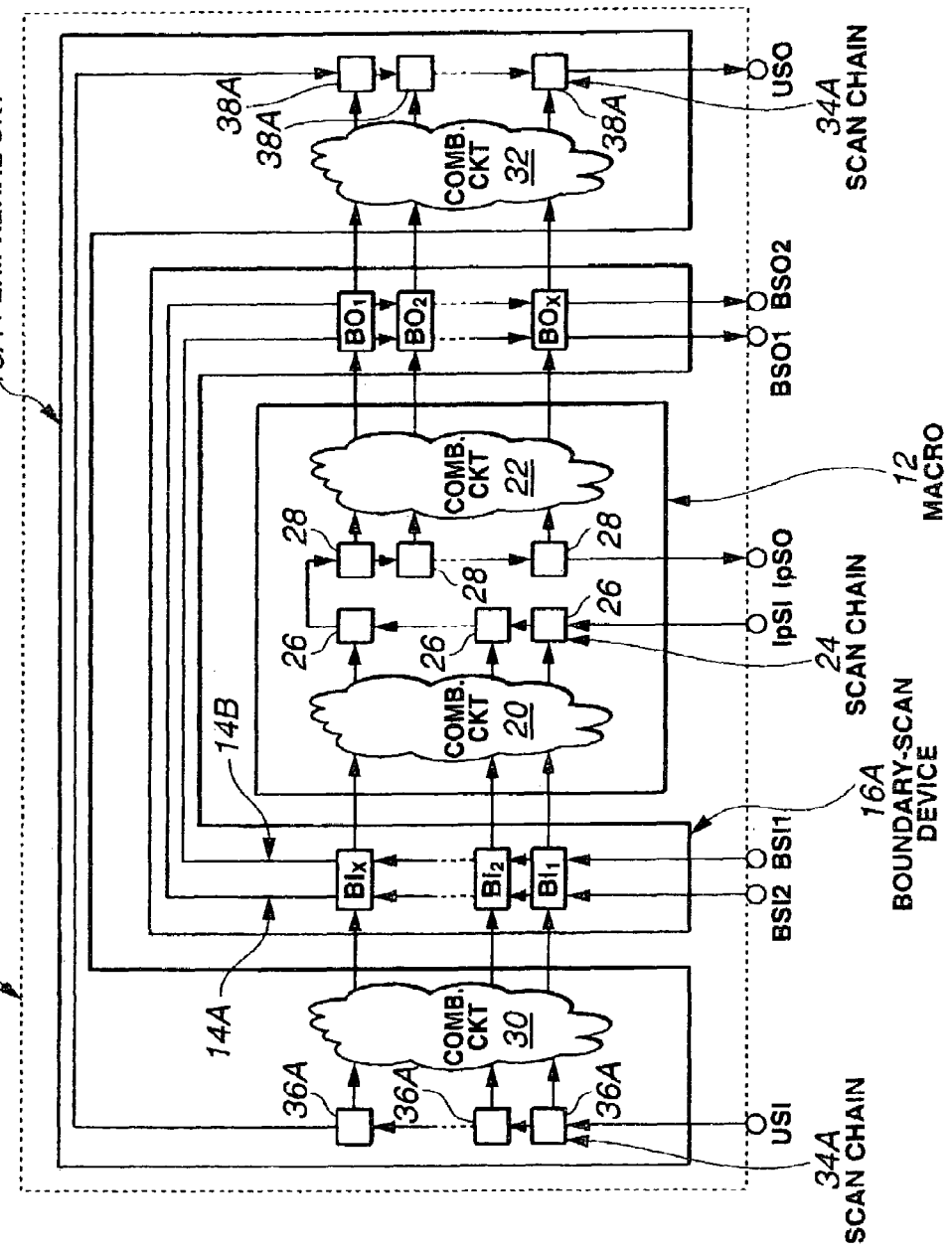
FIG. 4 is a block diagram of another custom LSI equipped with another boundary-scan device between a peripheral circuit and a macro.
Figure 5:
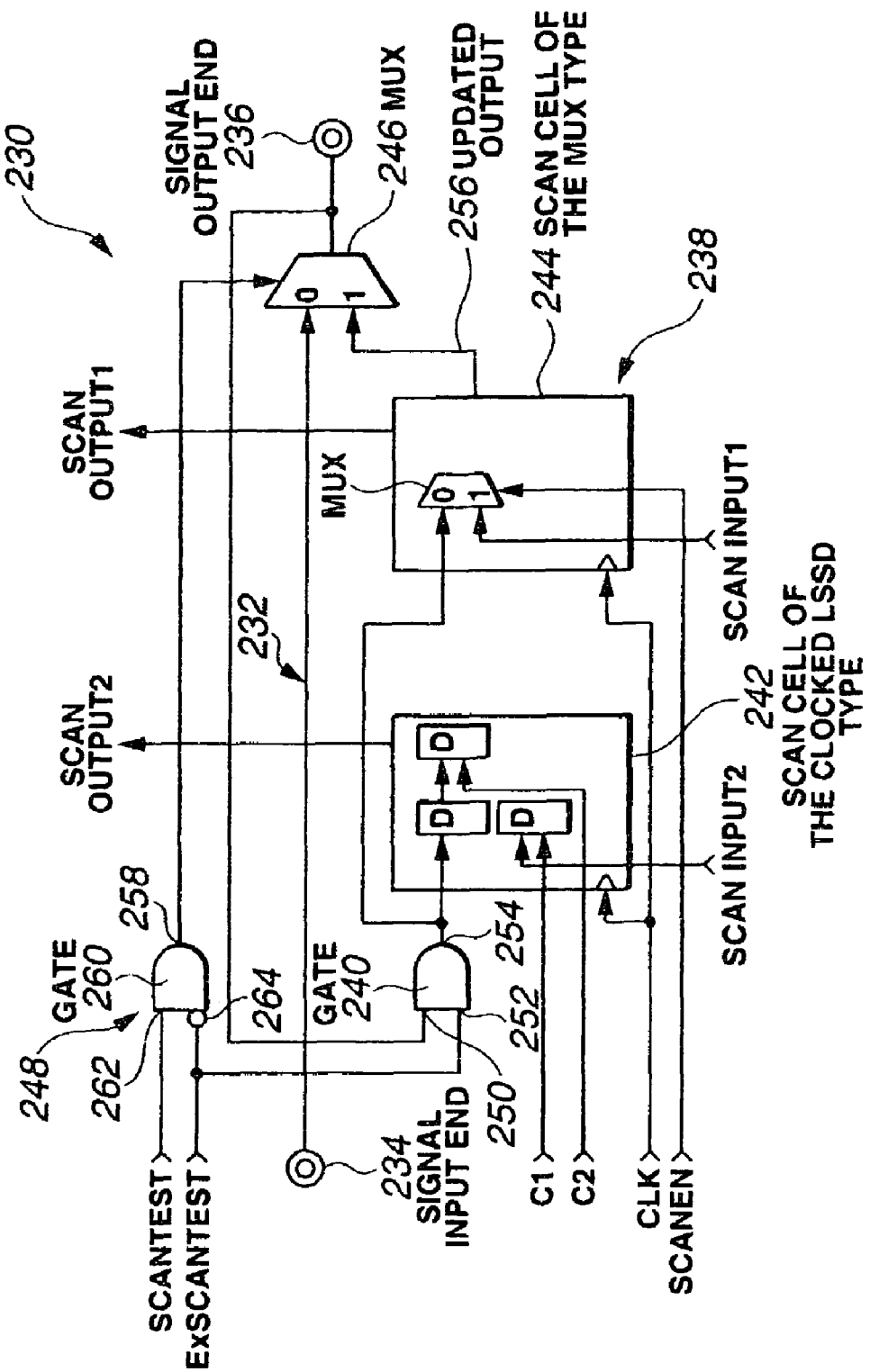
FIG. 5 illustrates another exemplary implementation of an input boundary-scan cell.
Figure 6:
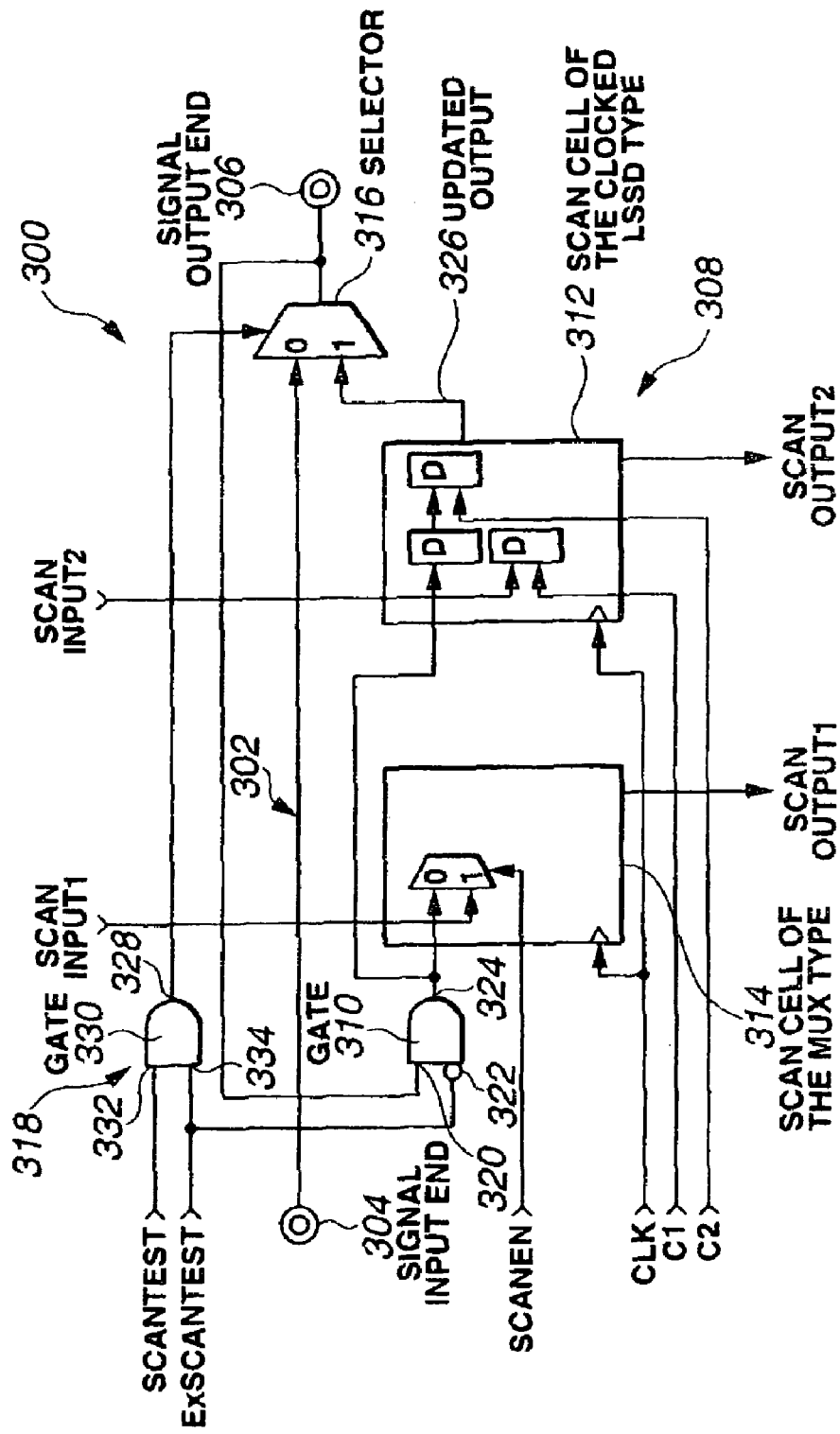
FIG. 6 illustrates another exemplary implementation of an output boundary-scan cell.

Referring to FIGS. 4-6, the second exemplary embodiment of the present invention will now be described. FIG. 4 is a block diagram of a custom LSI 10A. This custom LSI 10A is substantially the same as the custom LSI 10 shown in FIG. 1 except that a peripheral circuit 18A is equipped with a scan chain 34A including a number of scan cells 36A and 38A of the clocked LSSD type and a boundary-scan device 16A is equipped with two different scan chains 14A and 14B. The scan chain 14A includes a number of scan cells of the clocked LSSD type, and the scan chain 14B includes a number of scan cells of the multiplex type. A macro 12 used in the custom LSI 10A is substantially the same as that used in the custom LSI 10 shown in FIG. 1. The macro 12 is equipped with a scan chain 24 including a number of scan cells 26 and 28 of the multiplex type.

FIG. 5 illustrates an input boundary-scan cell 230 that could be used for each of the input boundary-scan cells $BI_1$, $BI_2$ ... $BI_x$ in FIG. 4. FIG. 6 illustrates an output boundary-scan cell 300 that could be used for each of the output boundary-scan cells $BO_1$, $BO_2$ ... $BO_x$ in FIG. 4

With reference to FIG. 5, the input boundary-scan cell 230 includes a signal path 232 for an input pin of the macro 12. The signal path 232 has a data signal input end 234 and a data signal output end 236. At the data signal input end 232, the boundary-scan cell 230 is coupled to one of a plurality of output pins of the peripheral circuit 18A. At the data signal output end 236, the boundary-scan cell 230 is coupled to one of a plurality of input pins of the macro 12. The input boundary-scan cell 230 includes a circuitry 238. Components of the circuitry 238 are a gate 240, a scan cell 242 of the clocked LSSD type, a scan cell 244 of the multiplex type, a selector 246, and a selector controlling logic unit 248.

The gate 240 has a first input 250 coupled to the data signal output end 236, a second input 252 coupled to a source of a test control signal ExSCANTEST, and an output 254. The test control signal ExSCANTEST indicates a device under test. The test control signal ExSCANTEST is at "1" level when the peripheral circuit 18 is a device under test, and at "1" level when the macro 12 is a device under test. If the test control signal ExSCANTEST is at "1" level, the gate 240 receives a signal on the data signal output end 236 as the first input 250 and provides it as the output 254. If the test control signal ExSCANTEST is at "0" level, the gate 240 provides a fixed value of "0" as the output 254. As the output 254, the fixed value is not limited to "0". The fixed value of any magnitude, for example, "1" may suffice as the output 254 if the test control signal ExSCANTEST is at "0" level. As the discussion proceeds, it will be noted that the signal on the output 254 is captured by the scan cell 242. For convenience in testing, the signal on the output 254 is held invariable when the peripheral circuit 18A is not a device under test, i.e., when the macro 12 is a device under test. From the description of this section, it is to be noted that the gate 240 is substantially the same as the gate 130 (see FIG. 2).

The scan cell 242 is of the clocked LSSD type. The scan cells 242 are interconnected to each other to form an input-side portion of scan chain 14A (see FIG. 4) between the serial input and output external connection test terminals BSI2 and BSO2.

The scan cell 244 is of the multiplexer type. The scan cells 244 are interconnected to form an input-side portion of scan chain 14B (see FIG. 4) between the serial input and output external connection test terminals BSI1 and BSO1. During test mode operations, in response to the test control signal SCANEN that controls capturing action and the clock signal CLK, the test pattern is shifted and updated to provide an updated output 256.

The selector 246 receives, as its inputs, the updated output 256 and the data signal on the data signal input end 234. In response to an output 258 of the selector controlling logic unit 248, the selector 246 selects the updated output 154 and provides it, as its output, on the data signal output end 236. Specifically, the selector 246 selects the updated output 256 as its output when the output 258 is at "1" level. The selector 246 selects the data signal on the data signal input end 234 when the output 258 is at "0" level.

The selector controlling logic unit 248 includes a logical element in the form of a gate 260. The gate 260 has a first input 262 coupled to a source of a test control signal SCANTEST and a second inverted input 264 coupled to a source of a test control signal ExSCANTEST. In the embodiment, the output 258 is at "1" level when the test control signal SCANTEST is at "1" level and the test control signal ExSCANTEST is at "0" level. Otherwise, the output 258 is at "0" level. The gate 260 is common to all of the selectors 246 of the input boundary-scan cells $BI_1$, $BI_2$ ... $BI_x$ so that only one of such gate 260 may be used to control all of the selectors 246. The selector controlling logic unit 248 is substantially the same as the selector controlling logic unit 136 (see FIG. 2).

With reference now to FIG. 6, the output boundary-scan cell 300 includes a signal path 302 for an output pin of the macro 12. The signal path 302 has a data signal input end 304 and a data signal output end 306. At the data signal input end 304, the boundary-scan cell 300 is coupled to one of a plurality of output pins of the macro 12. At the data signal output end 306, the boundary-scan cell 300 is coupled to one of a plurality of input pins of the peripheral circuit 18A. The output boundary-scan cell 300 includes a circuitry 308. Components of the circuitry 308 are a gate 310, a scan cell of the clocked LSSD type 312, a scan cell of the multiplex type 314, a selector 316, and a selector controlling logical logic unit 318.

The gate 310 has a first input 320 coupled to the data signal output end 306, a second inverted input 322 coupled to the source of test control signal ExSCANTEST, and an output 324. As different from the gate 240, the gate 310 is responsive to an inverted version of the test control signal ExSCANTEST. If the test control signal ExSCANTEST is at "0" level, the gate 310 receives a signal on the data signal output end 306 as the first input 320 and provides it as the output 324. If the test control signal ExSCANTEST is at "1" level, the gate 310 provides a fixed value of "0" as the output 324. As the output 324, the fixed value is not limited to "0". The fixed value of any magnitude, for example, "1" may suffice as the output 324 if the test control signal ExSCANTEST is at "1" level. As the discussion proceeds, it will be noted that the signal on the output 324 is captured by the scan cell 314. For convenience in testing, the signal on the output 324 is held invariable when the peripheral circuit 18A is a device under test, i.e., when the macro 12 is not a device under test.

The scan cell 312 is of the clocked LSSD type. The scan cells 312 are interconnected to each other to form an output-side portion of scan chain 14A (see FIG. 4) between the serial input and output external connection test terminals BSI2 and BSO2. During test mode operations, the scan cell 312 provides an updated output 326.

The scan cell 314 is of the multiplexer type. The scan cells 314 are interconnected to form an output-side portion of scan chain 14B (see FIG. 4) between the serial input and output external connection test terminals BSI1 and BSO1.

The selector 316 receives, as its inputs, the updated output 326 and the data signal on the data signal input end 304. In response to an output 328 of the selector controlling logic unit 318, the selector 316 selects the updated output 326 and provides it, as its output, on the data signal output end 306. Specifically, the selector 316 selects the updated output 326 as its output when the output 328 is at "1" level. The selector 316 selects the data signal on the data signal input end 304 when the output 328 is at "0" level.

The selector controlling logic unit 318 includes a logical element in the form of a gate 330. The gate 330 has a first input 332 coupled to the source of test control signal SCANTEST and a second input 334 coupled to the source of test control signal ExSCANTEST. In the embodiment, the output 328 is at "1" level when the test control signal SCANTEST is at "1" level and the test control signal ExSCANTEST is at "1" level. Otherwise, the output 328 is at "0" level. The gate 330 is common to all of the selectors 316 of the output boundary-scan cells $BO_1$, $BO_2$ ... $BO_x$ so that only one of such gate 330 may be used to control all of the selectors 316. The selector controlling logic unit 318 is substantially the same as the selector controlling logic unit 196 (see FIG. 3).

To allow the combinational circuits 30 and 32 within the peripheral circuit 18A to be tested, the scan chain 34A of the clocked LSSD type and the scan chain 14A of the clocked LSSD type within the boundary scan device 16A are used. In this case, the test control signal SCANTEST is at "1" level and the test control signal ExSCANTEST is at "1" level.

On the side of the input pins of the macro 12, the appropriate test pattern data is used as input signal to the scan chain 34A within the peripheral circuit 18A through the serial input external connection test terminal USI. The input scan cells 36A of the clocked LSSD type shift the test data and provide updated outputs, as inputs, to the combinational circuit 30. Outputs of the combinational circuit 30 are delivered out of the peripheral circuit 18A through its output pins to the data signal input ends 234 of the input boundary-scan cells $BI_1$, $BI_2$ ... $BI_x$. The signals on the data signal input ends 234 are allowed by the selectors 246 to appear at the data signal output ends 236. The signals at the data signal output ends 236 are allowed by the gates 240 to reach the capturing inputs of the scan cells 242 of the clocked LSSD type, and captured. The captured data are shifted out of the scan chain 14A of the boundary-scan device 16A through the serial output external connection test terminal BSO2 for test.

On the side of the output pins of the macro 12, the appropriate test pattern data is used as input signal to the scan chain 14A of the boundary-scan device 16A through the serial input external connection test terminal BSI2. The scan cells 312 of the clocked LSSD type shift the test data to provide updated outputs 326. The updated outputs 326 are selected by selectors 316 and delivered out of the output boundary-scan cells $BO_1$, $BO_2$ ... $BO_x$ through the data signal output ends 306. The signals on the data signal output ends 306 are fed, as inputs, to the combinational circuit 32 through the input pins of the peripheral circuit 18A. Outputs of the combinational circuit 32 are fed to the scan cells 38A of the scan chain 34A within the peripheral circuit 18A and captured by the scan cells 38A and shifted out of the scan chain 34A through the serial output external connection test terminal USO for test.

To allow the combinational circuits 20 and 22 within the macro 12 to be tested, the scan chain 14B of the multiplex type within the boundary-scan device 16A and the scan chain 24 of the multiplex type within the macro 12 are used. In this case, the test control signal SCANTEST is at "1" level and the test control signal ExSCANTEST is at "0" level.

On the side of the input pins of the macro 12, the appropriate test pattern data is used as input signal to the scan chain 14B of the boundary-scan device 16A through the serial input external connection test terminal BSI1. The scan cells 244 of the multiplex type shift the test data and provide updated outputs 256. The updated outputs 256 are selected by the selectors 246 and delivered out of the input boundary-scan cells $BI_1, BI_2 \ldots BI_x$ through the data signal output ends 236. The signals on the data signal output ends 236 are fed, as inputs, to the combinational circuit 20 through the input pins of the macro 12. Outputs of the combinational circuit 20 are fed to the scan cells 26 of the scan chain 24 within the macro 12 and captured by the scan cells 26 and shifted out of the scan chain 24 through the serial output external connection test terminal IpSO for test.

On the side of the output pins of the macro 12, the appropriate test pattern data is used as input signal to the scan chain 24 within the macro 12 through the serial input external connection test terminal IpSI. The output scan cells 28 shift the test data and provide updated outputs, as inputs, to the combinational circuit 22. Outputs of the combinational circuit 22 are delivered out of the macro 12 through its output pins to the data signal input ends 304 of the output boundary-scan cells $BO_1, BO_2 \ldots BO_x$. The signals on the data signal input ends 304 are allowed by the selectors 316 to appear at the data signal output ends 306. The signals at the data signal output ends 306 are allowed by the gates 310 to reach the capturing inputs of the scan cells 314 of the multiplex type, and captured in response to the test control signal SCANEN and clock signal CLK. The captured data are shifted out of the scan chain 14B of the boundary-scan device 16A through the serial output external connection test terminal BSO1 for test.

After the various tests of the components during test mode operations, the custom LSI 10A is tested using the serial input and output external connection test terminals. In this case, the test control signal SCANTEST is at "0" level and the test control signal ExSCANTEST is at "0" level. As the test control signal SCANTEST is at "0" level, the selectors 246 of the input boundary-scan cells $BI_1, BI_2 \ldots BI_x$ allow signal transmission from the data signal input to output ends 234 and 236 through the signal paths 232, and the selectors 316 of the output boundary-scan cells $BO_1, BO_2 \ldots BO_x$ allow signal transmission from the data signal input to output ends 304 and 306 through the signal paths 302.

With reference back to FIGS. 1 to 3, according to the first exemplary embodiment of the present invention, a signal transmission through each signal path 122, via selector 134, to the macro 12 is tested when the peripheral circuit 18 is under test, and a signal transmission through each signal path 182, via selector 194, from the macro 12 is tested when the macro 12 is under test. With reference now to FIGS. 4 to 6, according to the second exemplary embodiment of the present invention, a signal transmission through each signal path 232, via selector 246, to the macro 12 is tested when the peripheral circuit 18 is under test, and a signal transmission through each signal path 302, via selector 316 is tested when the macro 12 is under test. Accordingly, in each of the first and second exemplary embodiments, it is no longer necessary to test a signal transmission through each of signal paths to and from the macro 12 when the custom LSI as a whole is under test, making it possible to considerably simplify and shorten a test pattern by eliminating all tests but a transition test, i.e., a test to very that a transition from the test mode operations to normal mode operations is made properly. Detection of any faults or failures in a boundary-scan device in a custom LSI is significantly simplified to provide an enhanced test quality of the custom LSI. As generation of such test pattern does not require any circuit information on the macro 12, it is no longer necessary for the supplier to disclose the circuit information on the macro 12, thus preventing any leak of such circuit information.

Although the present invention and its advantage have been described in detail, it should be understood that various changes, substitutions and alternations could be made herein without departing from the sprit and scope of the invention.

This application claims the priority of Japanese Patent Application No. 2002-260040, filed Sep. 5, 2002, the disclosure of which is hereby incorporated by reference in its entirety.

What is claimed is:

1. A boundary-scan device comprising:
   a plurality of signal paths connected to a macro, each having a data signal input end and a data signal output end for signal transmission during normal mode operations; and
   a plurality of circuits for said plurality of signal paths, respectively, each having capability of capturing a signal transmission event that a signal has passed through one of said plurality of signal paths during test mode operations;
   wherein each of said plurality of circuits includes a gate having an input coupled to said data signal output end of one of said signal paths, and a scan cell having a capturing input coupled to an output of said gate.

2. The boundary-scan device as claimed in claim 1,
   wherein each of said plurality of circuits includes a selector having an output coupled to said data signal output end of one of said plurality of signal paths, a first input coupled to said data signal input end of said one signal path, and a second input coupled to said scan cell for said one signal path, and
   wherein said plurality of circuitries include a selector controlling logic unit,
   said selector controlling logic unit enabling each of said selectors to connect the first input thereof to the output thereof during normal mode operations,
   said selector controlling logic unit enabling each of selected ones of said selectors to connect the first input thereof to the output thereof and enabling each of non-selected ones of said selectors to connect the second input thereof to the output thereof during test mode operations.

3. The boundary-scan device as claimed in claim 2, wherein said selector controlling logic unit includes a plurality of first logic elements, each controlling one of said selected ones of said selectors, and a plurality of second logic elements, each controlling one of said non-selected ones of said selectors.

4. The boundary-scan device as claimed in claim 2, wherein said selector controlling logic unit includes a first logic element controlling each of said selected ones of said selectors, and a second logic element controlling each of said non-selected ones of said selectors.

5. The boundary-scan device as claimed in claim 1, wherein each of said plurality of signal paths and one of said plurality of circuits form one of a plurality of boundary scan cells.

6. The boundary-scan device as claimed in claim 5,
   wherein said plurality of boundary scan cells include:
   a plurality of input boundary scan cells, each being coupled, at said signal data input end thereof, to one of a plurality of output pins of a peripheral circuit and, at said signal data output end thereof, to one of a plurality of input pins of the macro; and a plurality of output boundary scan cells, each being coupled, at said signal data input end thereof, to one of a plurality of output pins of the macro and, at said signal data output end thereof, to one of a plurality of input pins of the peripheral circuit, wherein each of said plurality of input boundary scan cells allows signal transmission through said signal path thereof from said signal data input end to said signal data output end when the peripheral circuit is a device under test during test mode operations, wherein each of said plurality of output boundary scan cells allows signal transmission through said signal path thereof from said signal data input end to said signal data output end when the macro is a device under test during test mode operations.

7. The boundary-scan device as claimed in claim 6, wherein each of said plurality of input boundary scan cells includes an input-side gate having an input coupled to said data signal output end thereof;

wherein said plurality of input boundary scan cells include a plurality of scan cells, respectively, which are interconnected to form an input-side portion of a scan chain;

wherein, during test mode operations, said plurality of scan cells of said input-side portion of said scan chain are operative to capture gate outputs of said input-side gates, respectively, for shifting each of said captured gate outputs through said scan chain;

wherein, during test mode operations, said plurality of scan cells of said input-side portion of said scan chain are operative to update outputs, respectively;

wherein each of said plurality of input boundary scan cells includes an input-side selector having a first input coupled to one of said signal data input ends and a second input coupled to one of said plurality of scan cells of said input-side portion of said scan chain;

wherein, when the peripheral circuit is a device under test during test mode operations, each of said input-side selectors selects a signal on one of said data signal input ends to appear on the mating one of said data signal output ends;

wherein each of said plurality of output boundary scan cells includes an output-side gate having an input coupled to said data signal output end thereof;

wherein said plurality of output boundary scan cells include a plurality of scan cells, respectively, which are interconnected to form an output-side portion of said scan chain;

wherein, during test mode operations, said plurality of scan cells of said output-side portion of said scan chain are operative to capture gate outputs of said output-side gates, respectively, for shifting each of said captured gate outputs through said scan chain;

wherein, during test mode operations, said plurality of scan cells of said output-side portion of said scan chain are operative to update outputs, respectively;

wherein each of said plurality of output boundary scan cells includes an output-side selector having a first input coupled to one of said data signal input ends and a second input receiving said updated output; and wherein, when the macro is a device under test during test mode operations, each of said output-side selectors selects a signal on one of said data signal input ends to appear on the mating one of said data signal output ends.

8. The boundary-scan device as claimed in claim 7, wherein each said plurality of boundary scan cells includes a first scan cell of the first type and a second scan cell of the second type; and wherein said first scan cells are interconnected form a first scan chain for shifting captured data from one to another of said first scan cells and updating outputs, and said second scan cells are connected serially one after another to form a second scan chain for shifting captured data from one to another of said second scan cells.

9. The boundary-scan device as claimed in claim 8, wherein, during normal mode operations, each of said selectors selects a signal on one of said data signal input ends to appear on the mating one of said data signal output ends.

10. The boundary-scan device as claimed in claim 7, wherein, during normal mode operations, each of said selectors selects a signal on one of said data signal input ends to appear on the mating one of said data signal output ends.

11. The boundary-scan device as claimed in claim 5, wherein each of said plurality of boundary scan cells is coupled to one of pins of the macro and allows signal transmission from said data signal input end thereof to said data signal output end thereof for the signal to be captured.

12. The boundary-scan device as claimed in claim 11, wherein each of said plurality of output boundary scan cells includes a gate having an input coupled to said data signal output end thereof;

wherein said plurality of boundary scan cells include a plurality of scan cells, respectively, which are interconnected to form a scan chain;

wherein, during test mode operations, said plurality of scan cells of said scan chain are operative to capture gate outputs of said gates, respectively, for shifting each of said captured gate outputs through said scan chain;

wherein, during test mode operations, said plurality of scan cells of said output-side portion of said scan chain are operative to update outputs, respectively;

wherein each of said plurality of boundary scan cells includes a selector having a first input coupled to one of said data signal input ends and a second input receiving said updated output; and wherein a test control signal indicating a device under test during test mode operations causes selected one of said selectors to select a signal on one of said data signal input ends to appear on the mating one of said data signal output ends.

13. The boundary-scan device as claimed in claim 12, wherein each said plurality of boundary scan cells includes a first scan cell of the first type and a second scan cell of the second type; and wherein said first scan cells are interconnected to form a first scan chain for shifting captured data from one to another of said first scan cells and updating outputs, and said second scan cells are connected serially one after another to form a second scan chain for shifting captured data from one to another of said second scan cell.

14. The boundary-scan device as claimed in claim 13, wherein, during normal mode operations, each of said selectors selects a signal on one of said data signal input ends to appear on the mating one of said data signal output ends.

15. The boundary-scan device as claimed in claim 12, wherein, during normal mode operations, each of said selectors selects a signal on one of said data signal input ends to appear on the mating one of said data signal output ends.

16. A boundary-scan device comprising:

a plurality of signal paths connected to a macro, each having a data signal input end and a data signal output end for signal transmission during normal mode operations; and a plurality of circuits for said plurality of signal paths, respectively, each having capability of capturing a signal transmission event that a signal has passed through one of said plurality of signal paths during test mode operations;

wherein each of said plurality of circuits includes a gate having an input coupled to said data signal output end of one of said signal paths, and two scan cells of different types, each having a capturing input coupled to an output of said gate.

17. The boundary-scan device as claimed in claim 16, wherein each of said plurality of circuits includes a selector having an output coupled to said data signal output end of one of said plurality of signal paths, a first input coupled to said data signal input end of said one signal path, and a second input, said second input of each of said selectors being coupled to one of said two scan cells for said one signal path, and wherein said plurality of circuits include a selector controlling logic unit, said selector controlling logic unit enabling each of said selectors to connect the first input thereof to the output thereof during normal mode operations, said selector controlling logic unit enabling each of selected ones of said selectors to connect the first input thereof to the output thereof and enabling each of non-selected ones of said selectors to connect the second input thereof to the output thereof during test mode operations.

18. The boundary-scan device as claimed in claim 17, wherein said selector controlling logic unit includes a plurality of first logic elements, each controlling one of said selected ones of said selectors, and a plurality of second logic elements, each controlling one of said non-selected ones of said selectors.

19. The boundary-scan device as claimed in claim 17, wherein said selector controlling logic unit includes a first logic element controlling each of said selected ones of said selectors, and a second logic element controlling each of said non-selected ones of said selectors.

20. A boundary scan test circuit for performing signal transmission from an input end to an output end during normal mode, for performing scan input/output of a test pattern with an external terminal for exclusive use of a test during test mode operations, and for capturing a gate output of a signal appearing at said output end after the signal being transmitted to said output end from said input end during the test mode, comprising:

an input side boundary scan cell, inserted in each of signal paths at a boundary of a macro, which transmits a signal from said input end to said output end in response to a test control signal that is selected when an external side of the macro is regarded as a test object during the test mode; and an output side boundary scan cell, inserted in each of output signal paths at the boundary of the macro, which transmits a signal from said input end to said output end in response to a turning over signal of said control signal during the test mode.

21. The boundary scan test circuit as claimed in claim 20, wherein said input side boundary scan cell includes a scan cell, which constitutes a scan chain, and captures said gate output of said signal appearing at said output end, scan shifts and provides an updated output during the test mode, and a selector, which receives said updated output of said scan cell and a signal applied to said input end, and selects a signal applied to said input end in response to said test control signal and outputs the selected signal to said output end during the test mode, and wherein said output side boundary scan cell includes a scan cell, which constitutes a scan chain, and captures said gate output of said signal appearing at said output end, scan shifts and provides an updated output during the test mode, and a selector, which receives said updated output of said scan cell of said output boundary scan cell and a signal applied to said input end, and selects a signal applied to said input end in response to said turning over signal of said test control signal and outputs the selected signal to said output end during the test mode.

22. The boundary scan test circuit as claimed in claim 21, wherein said scan cells include a scan cell, which constitutes said scan chain, and captures said gate output of said signal appearing at said output end and captures said captured gate output during the test mode, and a scan cell, which constitutes another scan chain of the different method, scan shifts, and provides an updated output.

23. The boundary scan test circuit as claimed in claim 21 or 22, wherein said selector selects a signal applied to said input end during the normal mode.

* * * * *